(12) United States Patent
Kosaka et al.

(10) Patent No.: US 11,917,930 B2
(45) Date of Patent: Feb. 27, 2024

(54) RESISTANCE CHANGE DEVICE AND STORAGE DEVICE

(71) Applicant: Kioxia Corporation, Tokyo (JP)

(72) Inventors: Takao Kosaka, Mie (JP); Hiroki Tokuhira, Kanagawa (JP)

(73) Assignee: Kioxia Corporation, Tokyo (JP)

( * ) Notice: Subject to any disclaimer, the term of this patent is extended or adjusted under 35 U.S.C. 154(b) by 359 days.

(21) Appl. No.: 17/462,819

(22) Filed: Aug. 31, 2021

(65) Prior Publication Data

US 2022/0302385 A1 Sep. 22, 2022

(30) Foreign Application Priority Data

Mar. 18, 2021 (JP) ................. 2021-044917

(51) Int. Cl.
*H10N 70/00* (2023.01)
*H10B 63/00* (2023.01)
*H10N 70/20* (2023.01)
*G11C 13/00* (2006.01)

(52) U.S. Cl.
CPC ......... *H10N 70/8828* (2023.02); *H10B 63/24* (2023.02); *H10B 63/84* (2023.02); *H10N 70/235* (2023.02); *H10N 70/841* (2023.02); *H10N 70/8822* (2023.02); *H10N 70/8825* (2023.02); *G11C 2013/008* (2013.01)

(58) Field of Classification Search
None
See application file for complete search history.

(56) References Cited

U.S. PATENT DOCUMENTS

| 7,593,254 B2 | 9/2009 | Liu |
| 2006/0249724 A1 | 11/2006 | Krusin-Elbaum et al. |
| 2016/0087204 A1* | 3/2016 | Pandey ............. H10N 70/8836 257/2 |

(Continued)

FOREIGN PATENT DOCUMENTS

JP 4541861 B2 9/2010

OTHER PUBLICATIONS

Rao et al., "Reducing the stochasticity of crystal nucleation to enable subnanosecond memory writing", Science 358 (6369), 2017, 1423-1427.

(Continued)

*Primary Examiner* — Allison Bernstein
*Assistant Examiner* — Margaret B Hayes
(74) *Attorney, Agent, or Firm* — Foley & Lardner LLP

(57) ABSTRACT

A resistance change device of an embodiment includes: a first electrode; a second electrode; and a stack disposed between these electrodes, and including a first layer containing a resistance change material and a second layer in contact with the first layer. The resistance change material contains at least one of a first element such as Ge and a second element such as Sb, and at least one third element selected from Te, Se, S, and O. The second layer contains a crystal material containing at least one selected from a group consisting of a first material having a composition represented by (Ti,Zr,Hf)CoSb, (Zr,Hf)NiSn, or Fe(Nb,Zr,Hf)(Sb, Sn), a second material having a composition represented by Fe(V,Hf,W)(Al,Si), and a third material having a composition represented by Mg(Si,Ge,Sn).

14 Claims, 6 Drawing Sheets

(56) References Cited

U.S. PATENT DOCUMENTS

2016/0351801 A1* 12/2016 Campbell .......... H10N 70/8416

OTHER PUBLICATIONS

Ding et al., "Phase-change heterostructure enables ultralow noise and drift for memory operation", Science 366 (6462), 2019, 210-215.
Kurosaki et al., "Half-Heusler Compounds as Promising High-Performance Thermoelectric Materials", Netsu Sokutei 43 (3), 2016, 91-98, with English Translation.
Nishino, "New Development of Thermoelectric Materials Based on Heusler Compounds", J. Japan Inst. Met. Mater. vol. 79, No. 11, 2015, pp. 548-554 with English Translation.
Iida et al., "Manufacturing process for practical use of magnesium silicide-based thermoelectric materials", Materia Japan 55, 7, 2016, 302-306 with English Translation.

* cited by examiner

RESISTANCE CHANGE DEVICE AND STORAGE DEVICE

CROSS REFERENCE TO RELATED APPLICATION

This application is based upon and claims the benefit of priority from Japanese Patent Application No. 2021-044917, filed on Mar. 18, 2021; the entire contents of which are incorporated herein by reference.

FIELD

Embodiments disclosed herein relate to a resistance change device and a storage device.

BACKGROUND

A resistance change device having a resistance change layer as a nonvolatile memory layer is used for a storage device. As the resistance change device, there is known a phase change memory (PCM) having a layer containing a phase change material such as, for example, GeSbTe, as a resistance change layer. The phase change memory is required to realize an increase in speed of phase change from an amorphous structure to a crystal structure of a phase change material as a resistance change material, and a reduction in power consumption.

DETAILED DESCRIPTION

Figure 1:
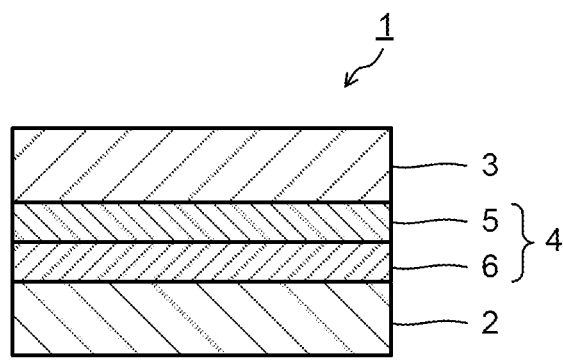
FIG. 1 is a sectional view illustrating a first example of a resistance change device of an embodiment.

A resistance change device of an embodiment includes: a first electrode; a second electrode; and a stack disposed between the first electrode and the second electrode, and including a first layer containing a resistance change material and a second layer in contact with the first layer. In the resistance change device of the embodiment, the phase change material contains at least one of at least one first element selected from a group consisting of germanium, tin, lead, silicon, and carbon and at least one second element selected from a group consisting of antimony, bismuth, and arsenic, and at least one third element selected from a group consisting of tellurium, selenium, sulfur, and oxygen. In the resistance change device of the embodiment, the second layer contains a crystal material containing at least one selected from a group consisting of:

a first material having a composition represented by $$(Ti_{a1}Zr_{b1}Hf_{c1})_{x1}Co_{y1}Sb_{100-x1-y1} \quad (1)$$

wherein a1, b1, and c1 are numbers representing atomic ratios satisfying $0 \leq a1 \leq 1$, $0 \leq b1 \leq 1$, $0 \leq c1 \leq 1$, and $a1+b1+c1=1$, and x1 and y1 are numbers representing atom % satisfying $30 \leq x1 \leq 35$, and $30 \leq y1 \leq 35$, $$(Zr_{a2}Hf_{b2})_{x2}Ni_{y2}Sn_{100-x2-y2} \quad (2)$$

wherein a2 and b2 are numbers representing atomic ratios satisfying $0 \leq a2 \leq 1$, $0 \leq b2 \leq 1$, and $a2+b2=1$, and x2 and y2 are numbers representing atom % satisfying $30 \leq x2 \leq 35$, and $30 \leq y2 \leq 35$, or $$Fe_{x3}(Nb_{a3}Zr_{b3}Hf_{c3})_{y3}(Sb_{a4}Sn_{b4})_{100-x3-y3} \quad (3)$$

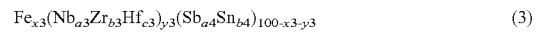

wherein a3, b3, c3, a4, and b4 are numbers representing atomic ratios satisfying $0 \leq a3 \leq 1$, $0 \leq b3 \leq 1$, $0 \leq c3 \leq 1$, $a1+b1+c1=1$, $0 \leq a4 \leq 1$, $0 \leq b4 \leq 1$, and $a4+b4=1$, and x3 and y3 are numbers representing atom % satisfying $30 \leq x3 \leq 35$, and $30 \leq y3 \leq 35$; a second material having a composition represented by $$Fe_{100-x4-y4}(V_{a5}Hf_{b5}W_{c5})_{x4}(Al_{a6}Si_{b6})_{y4} \quad (4)$$

wherein a5, b5, c5, a6, and b6 are numbers representing atomic ratios satisfying $0 \leq a5 \leq 1$, $0 \leq b5 \leq 1$, $0 \leq c5 \leq 1$, $a5+b5+c5=1$, $0 \leq a6 \leq 1$, $0 \leq b6 \leq 1$, and $a6+b6=1$, and x4 and y4 are numbers representing atom % satisfying $20 \leq x4 \leq 30$, and $20 \leq y4 \leq 30$; and a third material having a composition represented by $$Mg_{100-x5}(Si_{a7}Ge_{b7}Sn_{c7})_{x5} \quad (5)$$

wherein a7, b7, and c7 are numbers representing atomic ratios satisfying $0 \leq a7 \leq 1$, $0 \leq b7 \leq 1$, $0 \leq c7 \leq 1$, and $a7+b7+c7=1$, and x5 is a number representing atom % satisfying $30 \leq x5 \leq 35$.

Hereinafter, a resistance change device of an embodiment will be described with reference to the drawings. In respective embodiments, substantially the same constituent portions are denoted by the same reference numerals, and explanation thereof is sometimes partially omitted. The drawings are schematic, and the relation of thickness and planer dimension, a thickness ratio of the respective parts, and so on are sometimes different from actual ones. The term indicating a direction such as an upper or lower direction in the explanation, indicates a relative direction when a forming surface of a stacked film of a first electrode to be described later is faced upward and a direction of sequentially forming the stacked film and the like on the first electrode (stack direction of film) is set to an upper direction, unless otherwise specified, and is sometimes different from an actual direction based on a gravitational acceleration direction.

Figure 2:
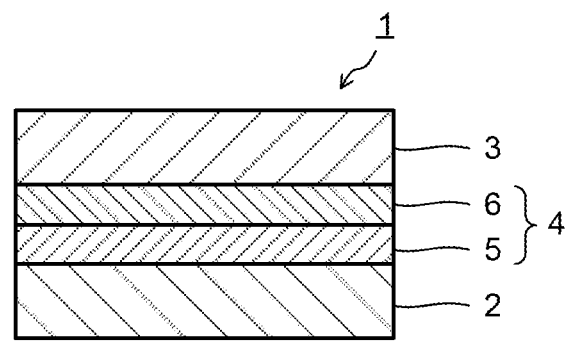
FIG. 2 is a sectional view illustrating a second example of the resistance change device of the embodiment.
Figure 3:
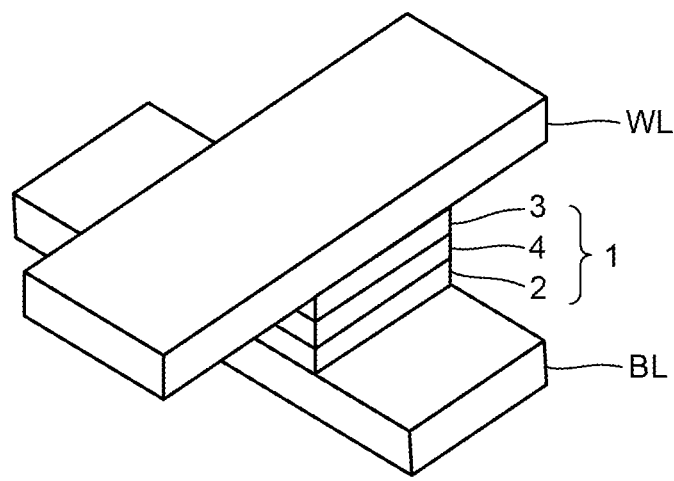
FIG. 3 is a perspective view illustrating the resistance change device of the embodiment.

FIG. 1 is a sectional view illustrating a first example of a basic configuration of a resistance change device 1 of an embodiment, FIG. 2 is a sectional view illustrating a second example of the basic configuration of the resistance change device 1 of the embodiment, and FIG. 3 is a perspective view illustrating the basic configuration of the resistance change device 1 of the embodiment. The resistance change device 1 illustrated in FIG. 1 and FIG. 2 includes a first electrode 2, a second electrode 3, and a stack 4 disposed between the first electrode 2 and the second electrode 3. The stack 4 has, as a first layer, a resistance change layer 5 containing a phase change material (resistance change material) and functioning as a nonvolatile memory layer. The stack 4 further has, as a second layer, a crystallization promoting layer 6 provided under the resistance change layer 5 so as to be directly in contact with the resistance change layer 5. The stack 4 may also have the crystallization promoting layer 6 provided on the resistance change layer 5 so as to be directly in contact with the resistance change layer 5, as illustrated in FIG. 2. As illustrated in FIG. 3, the resistance change device 1 is disposed at an intersection point between a bit line BL and a word line WL, and functions as a memory cell. Although FIG. 3 illustrates only the intersection point between one bit line BL and one word line WL, actually, the resistance change devices 1 as memory cells are disposed at respective intersection points between a large number of bit lines BL and word lines WL, to thereby configure a storage device.

As the phase change material that forms the resistance change layer 5, there is used a material containing at least one of at least one first element selected from a group consisting of germanium (Ge), tin (Sn), lead (Pb), silicon (Si), and carbon (C) and at least one second element selected from a group consisting of antimony (Sb), bismuth (Bi), and arsenic (As), and at least one third element selected from a group consisting of tellurium (Te), selenium (Se), sulfur (S), and oxygen (O). The phase change material may also contain at least one metal element (fourth element) selected from a group consisting of indium (In), silver (Ag), aluminum (Al), scandium (Sc), copper (Cu), gallium (Ga), chromium (Cr), zirconium (Zr), and titanium (Ti).

The above-described phase change material has a composition represented by the following formula (6), for example.

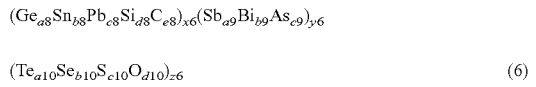

$$(Te_{a10}Se_{b10}S_{c10}O_{d10})_{z6} \quad (6)$$

Here, a8, b8, c8, d8, e8, a9, b9, c9, a10, b10, c10, and d10 are numbers representing atomic ratios satisfying $0 \leq a8 \leq 1$, $0 \leq b8 \leq 1$, $0 \leq c8 \leq 1$, $0 \leq d8 \leq 1$, $0 \leq e8 \leq 1$, $a8+b8+c8+d8+e8=1$, $0 \leq a9 \leq 1$, $0 \leq b9 \leq 1$, $0 \leq c9 \leq 1$, $a9+b9+c9=1$, $0 \leq a10 \leq 1$, $0 \leq b10 \leq 1$, $0 \leq c10 \leq 1$, $0 \leq d10 \leq 1$, and $a10+b10+c10+d10=1$, and x6, y6, and z6 are numbers representing atom % satisfying $0 \leq x6 \leq 60$, $0 \leq y6 \leq 80$, $20 \leq z6 \leq 80$, and $x6+y6+z6=100$.

The phase change material may also be a material having a composition represented by the following formula (7).

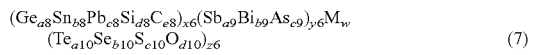

$$(Te_{a10}Se_{b10}S_{c10}O_{d10})_{z6} \quad (7)$$

Here, M is at least one metal element (fourth element) selected from a group consisting of In, Ag, Al, Sc, Cu, Ga, Cr, Zr, and Ti, a8, b8, c8, d8, e8, a9, b9, c9, a10, b10, c10, and d10 are numbers representing atomic ratios satisfying $0 \leq a8 \leq 1$, $0 \leq b8 \leq 1$, $0 \leq c8 \leq 1$, $0 \leq d8 \leq 1$, $0 \leq e8 \leq 1$, $a8+b8+c8+d8+e8=1$, $0 \leq a9 \leq 1$, $0 \leq b9 \leq 1$, $0 \leq c9 \leq 1$, $a9+b9+c9=1$, $0 \leq a10 \leq 1$, $0 \leq b10 \leq 1$, $0 \leq c10 \leq 1$, $0 \leq d10 \leq 1$, and $a10+b10+c10+d10=1$, and x6, y6, w, and z6 are numbers representing atom % satisfying $0 \leq x6 \leq 60$, $0 \leq y6 \leq 80$, $0 \leq w \leq 40$, $20 \leq z6 \leq 80$, and $x6+y6+w+z6=100$.

As concrete examples of the phase change material, there can be cited germanium-antimony-tellurium (GeSbTe), germanium-tellurium (GeTe), chromium-germanium-tellurium (CrGeTe), copper-germanium-tellurium (CuGeTe), indium-germanium-antimony-tellurium (InGeSbTe), carbon-germanium-antimony-tellurium (CGeSbTe), antimony-tellurium (SbTe), scandium-antimony-tellurium (ScSbTe), silicon-antimony-tellurium (SiSbTe), silver-indium-antimony-tellurium (AgInSbTe), and the like, but the material is not limited to these. Note that the material described by symbols of elements here (GeSbTe, for example) indicates a material containing those elements, in which a composition ratio of respective elements is not specified, and can be adjusted appropriately in accordance with intended phase change properties and so on.

Figure 4:
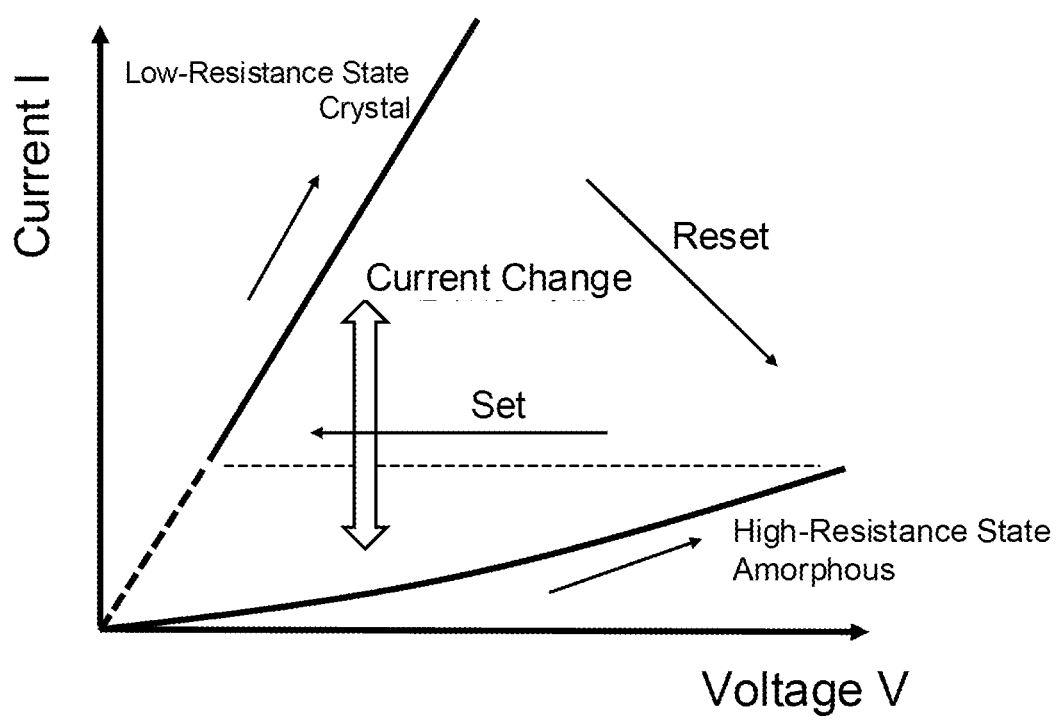
FIG. 4 is view illustrating a current-voltage characteristic in a phase change state of a resistance change layer of the resistance change device.

The phase change material as described above has a phase change property capable of being changed in a reversible manner between an amorphous phase and a crystal phase, and has a crystal phase of a cubic crystal as a stable structure or a metastable structure. The phase change material of the crystal phase has a low resistance, and the phase change material of the amorphous phase has a high resistance. As illustrated in FIG. 4, when a phase change material layer disposed between a pair of electrodes is in a crystal state, a resistance value thereof is low, and thus a low-resistance state is created. On the other hand, when the phase change material layer is in an amorphous state, a resistance value thereof is high, and thus a high-resistance state is created. The phase change between these crystal state and amorphous state is caused by Joule heating with electrical pulses, for example.

As illustrated in FIG. 4, when the phase change material layer in a crystal state is heated by applying a reset pulse thereto, and is subjected to rapid cooling by rapidly reducing the reset pulse, at least a part of the phase change material layer can be made to be in an amorphous state. On the contrary, when the phase change material layer in an amorphous state is heated by applying a set pulse thereto, and is subjected to slow cooling by gradually reducing the set pulse, the phase change material layer can be made to be in a crystal state. In the resistance change device 1 including the resistance change layer (phase change layer) 5 containing the phase change material, it is possible to enhance the property of the resistance change device 1 by increasing a phase change speed (crystallization speed) by using the set pulse.

For example, when GeSbTe is subjected to phase change from an amorphous state to a crystal state, four-membered rings of an ABAB (A: Ge, Sb, B: Te) structure are generated at a time of the set, and these four-membered rings are bonded to generate crystal growth nuclei. Next, these crystal growth nuclei are bonded to generate a NaCl-type metastable structure. Further, when crystal growth proceeds from the metastable structure, a stable structure of a cubic crystal is generated. If it is possible to promote, during such a crystal growth process, the generation of crystal growth nuclei realized by the bonding of four-membered rings of the ABAB structure, and the generation of the NaCl-type metastable structure realized by the bonding of crystal growth nuclei, a crystal growth speed of GeSbTe can be increased. The increase in the crystallization speed as above is not limited to GeSbTe, and can be applied to the entire phase change material having a crystal phase of a cubic crystal as a stable structure or a metastable structure.

Accordingly, in the resistance change device 1 of the embodiment, the crystallization promoting layer 6 containing the crystal material having the crystal structure of the cubic crystal is provided under or on the resistance change layer 5 so as to be directly in contact with the resistance change layer (phase change layer) 5 containing the phase change material. By disposing the resistance change layer 5 containing the phase change material on or under the crystallization promoting layer 6 containing the crystal material having the crystal structure of the cubic crystal so that the resistance change layer 5 is directly in contact with the crystallization promoting layer 6, the generation of crystal growth nuclei realized by the bonding of four-membered rings of the ABAB structure, and the generation of the NaCl-type metastable structure realized by the bonding of crystal growth nuclei, are promoted by the crystal structure of the cubic crystal of the crystallization promoting layer 6. Further, by making the four-membered ring structure of the ABAB structure to be close to the NaCl-type structure after crystallization, it is possible to promote the generation of the NaCl-type structure. Therefore, it is possible to increase the phase change speed from the amorphous state to the crystal state of the phase change material that forms the resistance change layer (phase change layer) 5. This is not limited to the generation of the NaCl-type metastable structure via the four-membered rings of the ABAB structure. As long as a phase change material having a crystal phase of a cubic crystal as a stable structure or a metastable structure is used, it is possible to increase the phase change speed from the amorphous state to the crystal state by adopting the crystallization promoting layer 6 containing the crystal material having the crystal structure of the cubic crystal.

As the crystal material having the crystal structure of the cubic crystal contained in the crystallization promoting layer 6, there can be cited the following first material, second material, or third material. The first material has a composition represented by $$(Ti_{a1}Zr_{b1}Hf_{c1})_{x1}Co_{y1}Sb_{100-x1-y1} \quad (1)$$

wherein a1, b1, and c1 are numbers representing atomic ratios satisfying $0 \le a1 \le 1$, $0 \le b1 \le 1$, $0 \le c1 \le 1$, and $a1+b1+c1=1$, and x1 and y1 are numbers representing atom % satisfying $30 \le x1 \le 35$, and $30 \le y1 \le 35$, $$(Zr_{a2}Hf_{b2})_{x2}Ni_{y2}Sn_{100-x2-y2} \quad (2)$$

wherein a2 and b2 are numbers representing atomic ratios satisfying $0 \le a2 \le 1$, $0 \le b2 \le 1$, and $a2+b2=1$, and x2 and y2 are numbers representing atom % satisfying $30 \le x2 \le 35$, and $30 \le y2 \le 35$, or $$Fe_{x3}(Nb_{a3}Zr_{b3}Hf_{c3})_{y3}(Sb_{a4}Sn_{b4})_{100-x3-y3} \quad (3)$$

wherein a3, b3, c3, a4, and b4 are numbers representing atomic ratios satisfying $0 \le a3 \le 1$, $0 \le b3 \le 1$, $0 \le c3 \le 1$, $a1+b1+c1=1$, $0 \le a4 \le 1$, $0 \le b4 \le 1$, and $a4+b4=1$, and x3 and y3 are numbers representing atom % satisfying $30 \le x3 \le 35$, and $30 \le y3 \le 35$.

The second material has a composition represented by $$Fe_{100-x4-y4}(V_{a5}Hf_{b5}W_{c5})_{x4}(Al_{a6}Si_{b6})_{y4} \quad (4)$$

wherein a5, b5, c5, a6, and b6 are numbers representing atomic ratios satisfying $0 \le a5 \le 1$, $0 \le b5 \le 1$, $0 \le c5 \le 1$, $a5+b5+c5=1$, $0 \le a6 \le 1$, $0 \le b6 \le 1$, and $a6+b6=1$, and x4 and y4 are numbers representing atom % satisfying $20 \le x4 \le 30$, and $20 \le y4 \le 30$.

The third material has a composition represented by $$Mg_{100-x5}(Si_{a7}Ge_{b7}Sn_{c7})_{x5} \quad (5)$$

wherein a7, b7, and c7 are numbers representing atomic ratios satisfying $0 \le a7 \le 1$, $0 \le b7 \le 1$, $0 \le c7 \le 1$, and $a7+b7+c7=1$, and x5 is a number representing atom % satisfying $30 \le x5 \le 35$. The crystal material that is applied to the crystallization promoting layer 6 contains at least one selected from a group consisting of the first material, the second material, and the third material.

Each of the first materials having the compositions represented by the formula (1), the formula (2), and the formula (3) is a Half-Heusler alloy, and has a crystal structure of MgAgAs-type cubic crystal. As concrete examples of the material represented by the formula (1), there can be cited ZrCoSb, HfCoSb, TiCoSb, and so on. As concrete examples of the material represented by the formula (2), there can be cited ZrNiSn, HfNiSn, and so on. The material represented by the formula (2) may also be a material in which a part of Zr or Hf is substituted with Ti, which is, for example, (Zr,Ti)NiSn, (Hf,Ti)NiSn, or the like. As concrete examples of the material represented by the formula (3), there can be cited FeNbSb, Fe(Nb,Zr)Sb, Fe(Nb,Hf)Sb, FeZrSb, and so on. The second material (material represented by the formula (4)) is a Full-Heusler alloy, and has a crystal structure of $Cu_2MnAl$-type cubic crystal. As concrete examples of the second material, there can be cited FeVAl, Fe(V,Hf)Al, FeV(Al,Si), and so on. The third material (material represented by the formula (5)) is a Mg alloy having a crystal structure of $CaF_2$-type cubic crystal. As concrete examples of the third material, there can be cited Mg(Si,Sn), Mg(Si,Ge), and so on.

As described above, each of the first material, the second material, and the third material has the crystal structure of the cubic crystal. By disposing the resistance change layer 5 containing the phase change material on the crystallization promoting layer 6 containing at least one selected from a group consisting of the first material, the second material, and the third material, so that the resistance change layer 5 is directly in contact with the crystallization promoting layer 6, the crystal structure of the cubic crystal of the crystallization promoting layer 6 provided as a contact layer (base layer, for example) with the resistance change layer (phase change layer) 5 promotes the phase change from the amorphous state to the crystal state of the cubic crystal of the phase change material that forms the resistance change layer (phase change layer) 5. Therefore, it is possible to increase the phase change speed from the amorphous state to the crystal state of the resistance change layer 5. This makes it possible to improve the property of the resistance change device 1.

When promoting the crystallization of the resistance change layer (phase change layer) 5 containing the phase change material by the crystallization promoting layer 6 containing the crystal material having the crystal structure of the cubic crystal, the crystal material contained in the crystallization promoting layer 6 preferably has a small lattice mismatch degree with respect to the phase change material contained in the resistance change layer 5. Concretely, when a lattice constant of the crystal material contained in the crystallization promoting layer 6 is set to a1, and a lattice constant of the phase change material contained in the resistance change layer 5 is set to a2, a lattice mismatch degree represented by "$(a1-a2)/a1 \times 100(\%)$" is preferably −10% or more and +10% or less. If the lattice mismatch degree is within ±10%, for example, the four-membered ring of the ABAB structure can be approximated to the NaCl-type structure after crystallization, and thus it is possible to further promote the generation of four-membered rings of the ABAB structure, the generation of crystal growth nuclei realized by bonding of the four-membered rings of the ABAB structure, and the generation of the NaCl-type metastable structure realized by bonding of the crystal growth nuclei. This is not limited to the case where the growth process such as the generation of four-membered rings of the ABAB structure, the generation of crystal growth nuclei, and the generation of the NaCl-type crystal, is performed, and even if a phase change material having a crystal structure of a cubic crystal which is subjected to another growth process is used, as long as the above-described lattice mismatch degree is within ±10%, it is possible to further promote the crystallization of the phase change material.

Out of the above-described concrete examples of the phase change material, the lattice constant a2 of GeSbTe ($Ge_2Sb_2Te_5$) is 6.00 angstrom, and the lattice constant a2 of SbTe ($Sb_2Te_3$) is 6.10 angstrom. With respect to such phase change materials, out of the above-described concrete examples of the crystal material contained in the crystallization promoting layer 6, the lattice constant a1 of ZrCoSb ($Zr_1Co_1Sb_1$) is 6.07 angstrom, the lattice constant a1 of ZrNiSn ($Zr_1Ni_1Sn_1$) is 6.11 angstrom, the lattice constant a1 of HfNiSn ($Hf_1Ni_1Sn_1$) is 6.08 angstrom, the lattice constant a1 of FeNbSb ($Fe_1Nb_1Sb_1$) is 5.95 angstrom, and the lattice constant a1 of FeVAl ($Fe_2VAl$) is 5.75 angstrom.

For example, when GeSbTe is used as the phase change material, the lattice mismatch degree of ZrCoSb as the crystal material is 1.15%, the lattice mismatch degree of ZrNiSn is 0.16%, the lattice mismatch degree of HfNiSn is 0.33%, the lattice mismatch degree of FeNbSb is −0.84%, and the lattice mismatch degree of FeVAl is −4.35%. Further, when SbTe is used as the phase change material, the lattice mismatch degree of ZrCoSb as the crystal material is −0.49%, the lattice mismatch degree of ZrNiSn is 0.16%, the lattice mismatch degree of HfNiSn is −0.32%, and the lattice mismatch degree of FeNbSb is −2.52%. By adopting such combinations of materials, it is possible to further promote the crystallization of the phase change material. The lattice mismatch degree of the crystal material contained in the crystallization promoting layer 6 with respect to the phase change material is more preferably −5% or more and +5% or less.

Figure 5:
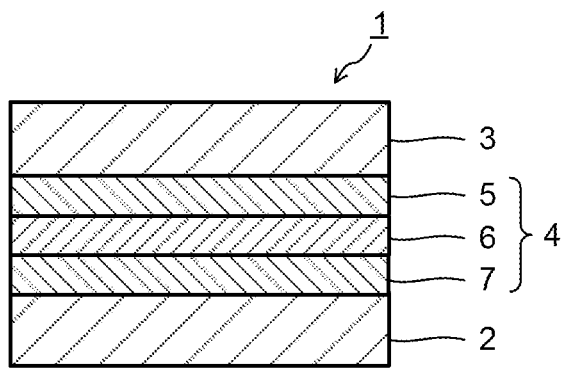
FIG. 5 is a sectional view illustrating a modified example of the resistance change device of the embodiment.

In the resistance change device 1 of the embodiment, the stack 4 may also have a buffer layer 7 provided under the crystallization promoting layer 6 so as to be directly in contact with the crystallization promoting layer 6, as illustrated in FIG. 5. The buffer layer 7 contains at least one selected from a group consisting of chromium (Cr), tantalum (Ta), vanadium (V), niobium (Nb), ruthenium (Ru), cobalt (Co), and iron (Fe). The material that forms the buffer layer 7 is not limited to the above-described metal elements, and it may also be an alloy of the above-described metal elements, an alloy containing at least one of the above-described metal elements (FeCo, for example), or the like. Each of these metal materials has a crystal structure of a cubic crystal, and by using a layer of such a metal material as the buffer layer 7, the crystallization promoting layer 6 itself can be sufficiently crystallized. Therefore, it is possible to further promote the crystallization of the phase change material.

Among the respective layers that form the stack 4, a film thickness of the crystallization promoting layer 6 is preferably 0.5 nm or more and 15 nm or less. If the film thickness of the crystallization promoting layer 6 is less than 0.5 nm, there is a possibility that the crystallization promoting layer 6 itself cannot be sufficiently crystallized. An increase in the film thickness of the crystallization promoting layer 6 to greater than 15 nm is not preferable since the function as the crystallization promoting layer 6 cannot be increased any more, and in addition to that, the thickness of the resistance change device 1 becomes excessively thick. A film thickness of the buffer layer 7 is preferably 0.5 nm or more and 15 nm or less. If the film thickness of the buffer layer 7 is less than 0.5 nm, the effect provided by the layer may not be obtained sufficiently. An increase in the film thickness of the buffer layer 7 to greater than 15 nm is not preferable since the function of the layer cannot be increased any more, and in addition to that, the thickness of the resistance change device 1 becomes excessively thick.

Further, the Half-Heusler alloy having the composition represented by the above-described formula (1), formula (2), or formula (3), and the Full-Heusler alloy having the composition represented by the formula (4) have a property that the heat conductivity is low. At 300 K, TiCoSb has the heat conductivity of 14 W/mK, ZrNiSn has the heat conductivity of 9 W/mK, and $Fe_2VAl$ has the heat conductivity of 27 W/mK. These values are nearly the same as or lower than values of W (178 W/mK), Ti (22 W/mK), and C (100-250 W/mK) used as electrodes. The Heusler alloy can adjust its physical property value by adjusting a composition ratio of constituent elements or substituting the constituent element with another element. For example, in $Ti_{0.25}(Zr_{0.50}Hf_{0.50})_{0.75}CoSb$ obtained by substituting a part of Ti of TiCoSb with Zr and Hf, the heat conductivity can be reduced to 6 W/mK. In $Fe_2VAl$, by substituting a part of Al with Si, the heat conductivity can be reduced to about 4 W/mK. The same applies to the Mg alloy having the composition represented by the formula (5). By disposing the crystallization promoting layer 6 having the low heat conductivity so as to be in contact with the resistance change layer 5 containing the phase change material, the crystallization promoting layer 6 exhibits an effect of keeping heat in the resistance change layer 5 at a time of performing heating when applying a set pulse or a reset pulse to the phase change material to cause phase change. Therefore, it becomes possible to reduce power consumption when causing the phase change of the resistance change layer 5 containing the phase change material from the amorphous phase to the crystal phase and from the crystal phase to the amorphous phase, to thereby reduce power consumption of the resistance change device 1.

Figure 6:
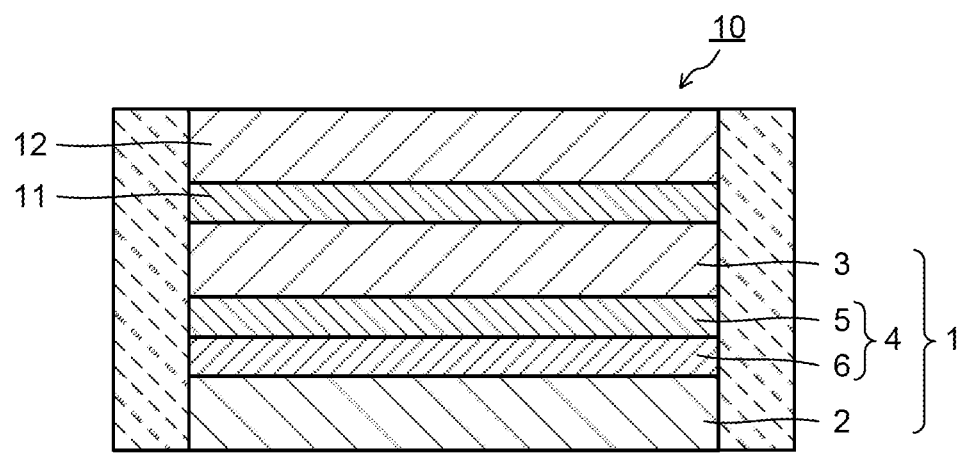
FIG. 6 is a sectional view illustrating a first example of a memory cell using the resistance change device of the embodiment.

As illustrated in FIG. 6, in a memory cell 10 using the resistance change device 1, a switch layer 11 is disposed on the resistance change device 1, for example. The memory cell 10 having the switch layer 11 includes the resistance change device 1 including the resistance change layer 5, the switch layer 11 disposed on the second electrode 3 of the resistance change device 1, and a third electrode 12 disposed on the switch layer 11. The switch layer 11 is disposed so as to be electrically connected to the resistance change layer 5, and has a function (switch function) of switching on/off of a current to the resistance change layer 5.

The switch layer 11 has an electric property that when a voltage of a threshold value (Vth) or more is applied thereto, a state thereof rapidly shifts from an off-state where a resistance value is high to an on-state where the resistance value is low. Specifically, when a voltage applied to the switch layer 11 is lower than the threshold value (Vth), the switch layer 11 functions as an insulator, and blocks a current that flows through the resistance change layer 5 to create a state where the resistance change layer 5 is selected. When the voltage applied to the switch layer 11 exceeds the threshold value (Vth), the resistance value of the switch layer 11 rapidly decreases and the switch layer 11 functions as a conductor, resulting in that the current flows through the resistance change layer 5 via the switch layer 11, to thereby create a state where the resistance change layer 5 is not selected.

Figure 7:
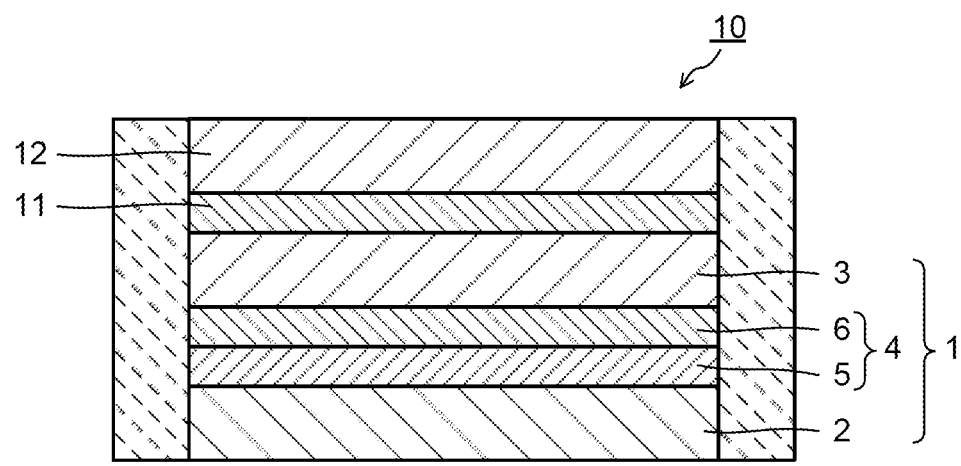
FIG. 7 is a sectional view illustrating a second example of the memory cell using the resistance change device of the embodiment.
Figure 8:
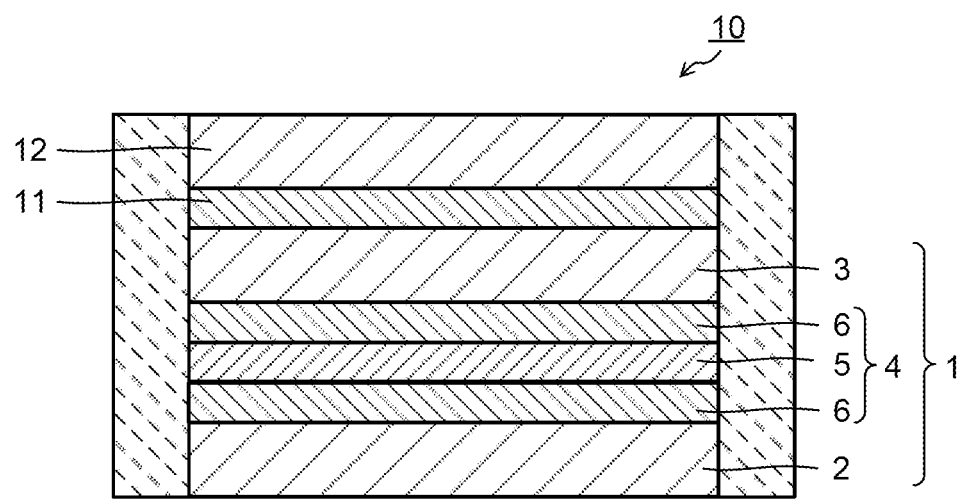
FIG. 8 is a sectional view illustrating a third example of the memory cell using the resistance change device of the embodiment.
Figure 9:
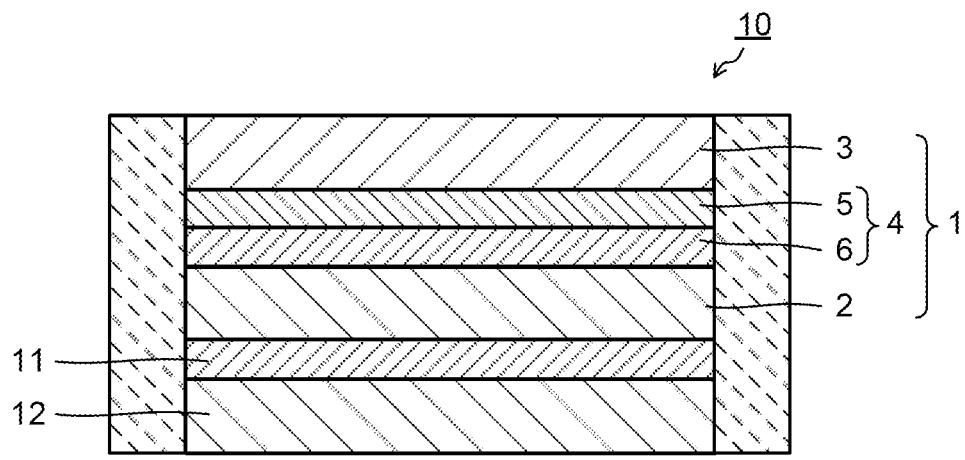
FIG. 9 is a sectional view illustrating a fourth example of the memory cell using the resistance change device of the embodiment.
Figure 10:
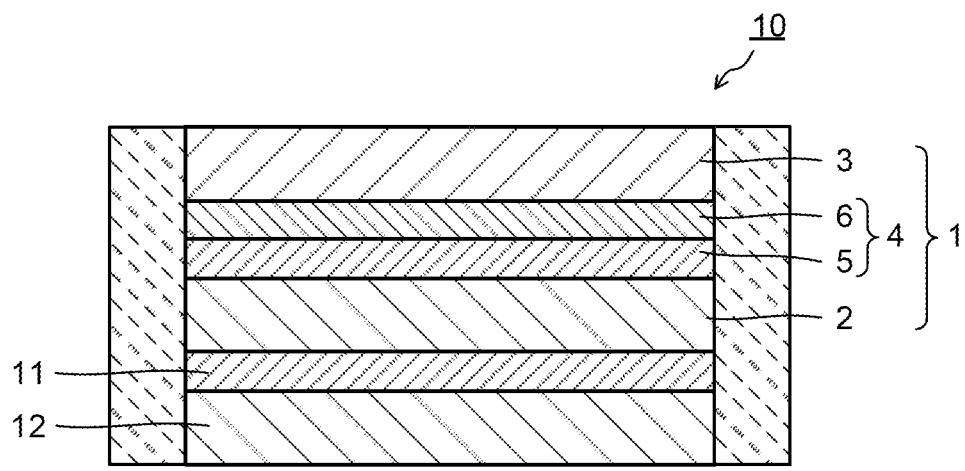
FIG. 10 is a sectional view illustrating a fifth example of the memory cell using the resistance change device of the embodiment.
Figure 11:
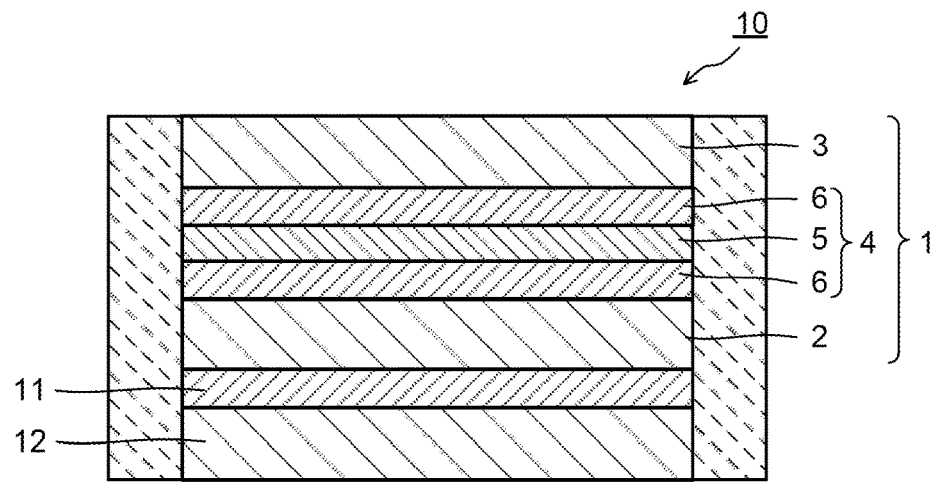
FIG. 11 is a sectional view illustrating a sixth example of the memory cell using the resistance change device of the embodiment.

The structure of the memory cell 10 is not limited to the configuration illustrated in FIG. 6. As illustrated in FIG. 7, the crystallization promoting layer 6 in the resistance change device 1 may also be disposed on the resistance change layer 5. As illustrated in FIG. 8, the resistance change layer 5 in the resistance change device 1 may also be sandwiched by the crystallization promoting layers 6 disposed on and under the resistance change layer 5. As illustrated in FIG. 9, the resistance change device 1 may also be disposed on the switch layer 11. As illustrated in FIG. 10, it is also possible that the resistance change device 1 is disposed on the switch layer 11, and then the crystallization promoting layer 6 is disposed on the resistance change layer 5. As illustrated in FIG. 11, it is also possible that the resistance change device 1 is disposed on the switch layer 11, and then the resistance change layer 5 is sandwiched by the crystallization promoting layers 6 disposed on and under the resistance change layer 5.

As a material that forms the switch layer 11, there can be cited a material containing at least one chalcogen element selected from a group consisting of tellurium (Te), selenium (Se), and sulfur (S), for example. Such a switch material may also contain a chalcogenide being a compound containing the chalcogen element. The material containing the chalcogen element may also contain at least one element selected from a group consisting of aluminum (Al), gallium (Ga), indium (In), silicon (Si), germanium (Ge), tin (Sn), arsenic (As), phosphorus (P), antimony (Sb), and bismuth (Bi). Further, the material containing the chalcogen element may also contain at least one element selected from a group consisting of nitrogen (N), oxygen (O), carbon (C), and boron (B). As examples of such a switch material, there can be cited GeSbTe, GeTe, SbTe, SiTe, AlTeN, GeAsSe, and so on. However, the switch material is not limited to the material containing the chalcogen element, and it may also be a material which does not contain the chalcogen element.

In the memory cell 10 having the switch layer 11, when the switch layer 11 is heated by applying a predetermined voltage thereto, the switch layer 11 functions as a heat source. The heat of the switch layer 11 is applied to the resistance change layer 5 via the electrode 3 or 2, and the phase change material contained in the resistance change layer 5 is heated and melted. At this time, if the heat conductivity of the crystal material contained in the crystallization promoting layer 6 is low, the heat is insulated by the crystallization promoting layer 6 and the heat is kept in the layer, resulting in that the crystallization promoting layer 6 functions as a heater. This makes it possible to reduce power consumption required for melting the phase change material. Also from a point of reducing the power consumption required for melting the phase change material contained in such a resistance change layer 5, the crystallization promoting layer 6 preferably contains the Half-Heusler alloy having the composition represented by the formula (1), the formula (2), or the formula (3), the Full-Heusler alloy having the composition represented by the formula (4), or the Mg alloy having the composition represented by the formula (5). The crystallization promoting layer 6 also contributes to promotion of the melting of the phase change material, which makes it possible to improve the properties of the resistance change device 1 and the memory cell 10.

Figure 12:
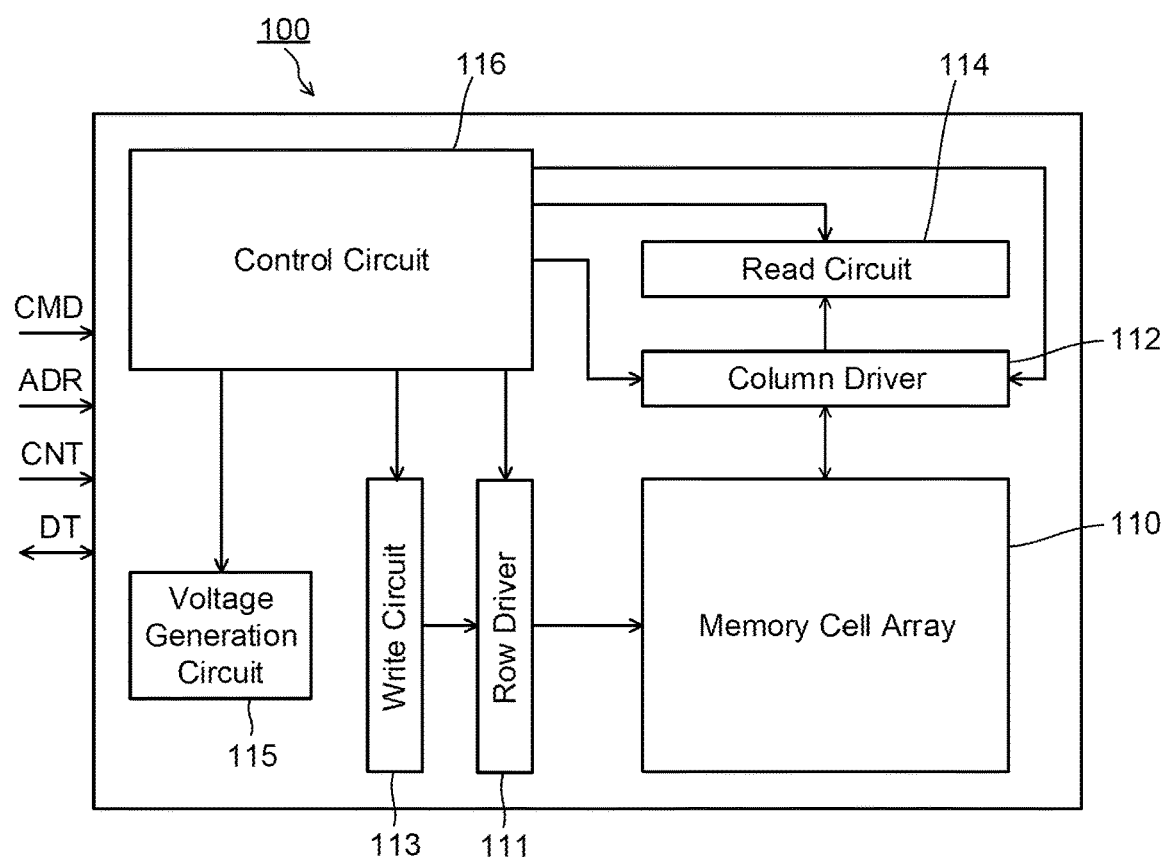
FIG. 12 is a block diagram illustrating a configuration example of a storage device.

FIG. 12 is a block diagram illustrating a configuration example of a storage device. A storage device 100 includes a memory cell array 110, a row driver 111, a column driver 112, a write circuit 113, a read circuit 114, a voltage generation circuit 115, and a control circuit 116. The memory cell array 110 includes the memory cell in the embodiment described above.

The row driver 111 controls plural rows of the memory cell array 110. The row driver 111 receives a row address signal based on a decoding result of an address signal ADR input from the outside from the control circuit 116. The row driver 111 sets a word line WL of a row selected by the row address signal to a selected state. The row driver 111 has circuits such as, for example, a multiplexer (word line selection circuit) and a word line driver.

The column driver 112 controls plural columns of the memory cell array 110. The column driver 112 receives a column address signal based on the decoding result of the address signal ADR from the control circuit 116. The column driver 112 sets a bit line BL of a column selected by the column address signal to a selected state. The column driver 112 has circuits such as, for example, a multiplexer (bit line selection circuit) and a bit line driver.

The write circuit 113 performs various controls for data write operations. The write circuit 113 receives a data signal DT input from the outside. The write circuit 113 supplies write pulses formed by current and/or voltage to the memory cell array 110 during the write operation. This allows data to be written to a memory cell MC. The write circuit 113 is electrically connected to the memory cell array 110 via the row driver 111. The write circuit 113 has circuits such as, for example, a voltage source and/or a current source, a pulse generation circuit, and a latch circuit.

The read circuit 114 performs various controls for data read operations. The read circuit 114 supplies read pulses (for example, read current) to the memory cell array 110 during the read operation. The read circuit 114 senses a potential or current value of the bit line BL. Based on this sense result, data in the memory cell MC can be read out. The read circuit 114 transfers read data signals to the outside. The read circuit 114 is connected to the memory cell array 110 via the column driver 112. The read circuit 114 has circuits such as, for example, a voltage source and/or a current source, a pulse generation circuit, a latch circuit, and a sense amplifier circuit.

The write circuit 113 and the read circuit 114 are not limited to mutually independent circuits. For example, the write circuit 113 and the read circuit 114 may be disposed in the storage device 100 as a single integrated circuit with common components that can be used mutually.

The voltage generation circuit 115 generates voltages for various operations of the memory cell array 110 using a power supply voltage supplied from the outside. The voltage generation circuit 115 supplies the generated various voltages to each of the row driver 111, the column driver 112, the write circuit 113, and the read circuit 114.

The control circuit 116 has, for example, a command register and an address register. The control circuit 116 controls the row driver 111, the column driver 112, the write circuit 113, the read circuit 114, and the voltage generation circuit 115 based on a command signal CMD, the address signal ADR, and a control signal CNT input from the outside, for example, to perform operations such as read operations, write operations, and erase operations.

The command signal CMD is a signal that indicates operations to be performed by the storage device 100. For example, the address signal ADR is a signal that indicates coordinates of one or more memory cells MC to be operated in the memory cell array 110 (hereinafter, referred to as selected cells). The address signal ADR includes the row address signal and the column address signal of the memory cell MC. The control signal CNT is a signal for controlling, for example, an operation timing between the storage device 100 and an external device and an internal operation timing of the storage device 100.

While certain embodiments of the present invention have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the invention.

What is claimed is:

1. A resistance change device, comprising: a first electrode; a second electrode; and a stack disposed between the first electrode and the second electrode, and including a first layer containing a resistance change material and a second layer in contact with the first layer, wherein:
the resistance change material contains at least one of at least one first element selected from a group consisting of germanium, tin, lead, silicon, and carbon and at least one second element selected from a group consisting of antimony, bismuth, and arsenic, and at least one third element selected from a group consisting of tellurium, selenium, sulfur, and oxygen; and
the second layer contains a crystal material containing at least one selected from a group consisting of:
a first material having a composition represented by $$(Ti_{a1}Zr_{b1}Hf_{c1})_{x1}Co_{y1}Sb_{100-x1-y1} \quad (1)$$

wherein a1, b1, and c1 are numbers representing atomic ratios satisfying $0 \leq a1 \leq 1$, $0 \leq b1 \leq 1$, $0 \leq c1 \leq 1$, and $a1+b1+c1=1$, and x1 and y1 are numbers representing atom % satisfying $30 \leq x1 \leq 35$, and $30 \leq y1 \leq 35$, $$(Zr_{a2}Hf_{b2})_{x2}Ni_{y2}Sn_{100-x2-y2} \quad (2)$$

wherein a2 and b2 are numbers representing atomic ratios satisfying $0 \leq a2 \leq 1$, $0 \leq b2 \leq 1$, and $a2+b2=1$, and x2 and y2 are numbers representing atom % satisfying $30 \leq x2 \leq 35$, and $30 \leq y2 \leq 35$, or $$Fe_{x3}(Nb_{a3}Zr_{b3}Hf_{c3})_{y3}(Sb_{a4}Sn_{b4})_{100-x3-y3} \quad (3)$$

wherein a3, b3, c3, a4, and b4 are numbers representing atomic ratios satisfying $0 \leq a3 \leq 1$, $0 \leq b3 \leq 1$, $0 \leq c3 \leq 1$, $a1+b1+c1=1$, $0 \leq a4 \leq 1$, $0 \leq b4 \leq 1$, and $a4+b4=1$, and x3 and y3 are numbers representing atom % satisfying $30 \leq x3 \leq 35$, and $30 \leq y3 \leq 35$;
a second material having a composition represented by $$Fe_{100-x4-y4}(V_{a5}Hf_{b5}W_{c5})_{x4}(Al_{a6}Si_{b6})_{y4} \quad (4)$$

wherein a5, b5, c5, a6, and b6 are numbers representing atomic ratios satisfying $0 \leq a5 \leq 1$, $0 \leq b5 \leq 1$, $0 \leq c5 \leq 1$, $a5+b5+c5=1$, $0 \leq a6 \leq 1$, $0 \leq b6 \leq 1$, and $a6+b6=1$, and x4 and y4 are numbers representing atom % satisfying $20 \leq x4 \leq 30$, and $20 \leq y4 \leq 30$; and
a third material having a composition represented by $$Mg_{100-x5}(Si_{a7}Ge_{b7}Sn_{c7})_{x5} \quad (5)$$

wherein a7, b7, and c7 are numbers representing atomic ratios satisfying $0 \leq a7 \leq 1$, $0 \leq b7 \leq 1$, $0 \leq c7 \leq 1$, and $a7+b7+c7=1$, and x5 is a number representing atom % satisfying $30 \leq x5 \leq 35$.

2. The device according to claim 1, wherein the first layer is provided above the second layer.

3. The device according to claim 1, wherein the resistance change material has a crystal structure of a cubic crystal as a stable structure or metastable structure, and each of the first material, the second material, and the third material has a crystal structure of a cubic crystal.

4. The device according to claim 3, wherein the first material has a MgAgAs-type crystal structure.

5. The device according to claim 3, wherein the second material has a $Cu_2MnAl$-type crystal structure.

6. The device according to claim 3, wherein the third material has a $CaF_2$-type crystal structure.

7. The device according to claim 1, wherein the resistance change material has a composition represented by $$(Ge_{a8}Sn_{b8}Pb_{c8}Si_{d8}C_{e8})_{x6}(Sb_{a9}Bi_{b9}As_{c9})_{y6}(Te_{a10}Se_{b10}S_{c10}O_{d10})_{z6} \quad (6)$$

wherein a8, b8, c8, d8, e8, a9, b9, c9, a10, b10, c10, and d10 are numbers representing atomic ratios satisfying $0 \leq a8 \leq 1$, $0 \leq b8 \leq 1$, $0 \leq c8 \leq 1$, $0 \leq d8 \leq 1$, $0 \leq e8 \leq 1$, $a8+b8+c8+d8+e8=1$, $0 \leq a9 \leq 1$, $0 \leq b9 \leq 1$, $0 \leq c9 \leq 1$, $a9+b9+c9=1$, $0 \leq a10 \leq 1$, $0 \leq b10 \leq 1$, $0 \leq c10 \leq 1$, $0 \leq d10 \leq 1$, and $a10+b10+c10+d10=1$, and x6, y6, and z6 are numbers representing atom % satisfying $0 \leq x6 \leq 60$, $0 \leq y6 \leq 80$, $20 \leq z6 \leq 80$, and $x6+y6+z6=100$.

8. The device according to claim 1, wherein the resistance change material contains at least one fourth element selected from a group consisting of indium, silver, aluminum, scandium, copper, gallium, chromium, zirconium, and titanium.

9. The device according to claim 8, wherein the resistance change material contains at least one selected from a group consisting of germanium-antimony-tellurium, germanium-tellurium, chromium-germanium-tellurium, copper-germanium-tellurium, indium-germanium-antimony-tellurium, carbon-germanium-antimony-tellurium, antimony-tellurium, scandium-antimony-tellurium, silicon-antimony-tellurium, and silver-indium-antimony-tellurium.

10. The device according to claim 1, wherein a lattice mismatch degree between the resistance change material and the crystal material is in a range of −10% or more and +10% or less.

11. The device according to claim 1, wherein the stack further includes a third layer in contact with the second layer, wherein the third layer contains at least one selected from a group consisting of chromium, tantalum, vanadium, niobium, ruthenium, cobalt, and iron.

12. The device according to claim 11, wherein the third layer has a crystal structure of a cubic crystal.

13. The device according to claim 1, further comprising a switch layer electrically connected to the first layer.

14. A storage device, comprising:
a memory cell array including a memory cell including the resistance change device according to claim 1; and
a control circuit controlling a read operation and a write operation of the memory cell array.

* * * * *